United States Patent
Alince et al.

(10) Patent No.: US 6,326,124 B1
(45) Date of Patent: Dec. 4, 2001

(54) FLEXOGRAPHIC PRINTING FORM MADE BY COVERING THE EDGES OF PHOTOPOLYMERIZABLE PRINTING PLATES FOR FLEXOGRAPHIC PRINTING

(75) Inventors: Wolfgang Alince, Neu-Isenburg; Dietmar Dudek, Langen, both of (DE)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/589,845

(22) Filed: Jun. 8, 2000

Related U.S. Application Data

(62) Division of application No. 09/009,598, filed on Jan. 20, 1998, now abandoned.

(30) Foreign Application Priority Data

Mar. 6, 1997 (DE) .............................................. 197 09 037

(51) Int. Cl.$^7$ .............................. G03C 1/76; G03C 1/765; G03C 1/815; G03F 7/11; G03F 7/20
(52) U.S. Cl. ........................ 430/273.1; 430/269; 430/306; 430/300
(58) Field of Search ................................ 430/273.1, 269, 430/306, 300

(56) References Cited

U.S. PATENT DOCUMENTS

| | | | |
|---|---|---|---|
| 4,683,190 | 7/1987 | Sondergeld et al. | 430/281 |
| 4,758,500 * | 7/1988 | Schober et al. | 430/306 |
| 4,927,740 * | 5/1990 | Wallbillich et al. | 430/300 |
| 5,795,834 * | 8/1998 | Deeb et al. | 442/62 |

FOREIGN PATENT DOCUMENTS

| | | | |
|---|---|---|---|
| 0 568 841 A1 | 11/1993 | (EP) | G03F/1/00 |
| 1 284 296 A | 8/1972 | (GB) | B32B/5/08 |
| WO 94/03838 * | 2/1794 | (WO) . | |

OTHER PUBLICATIONS

Derwent Abstract 1994–128697 (English Abstract Cited in the Office Action)—English Abstract for Japanese Document JP06071159, Mar. 15, 1994.*

Patent Abstract JP3217477A, Oil–resistant acryl tackifiers prodn.—by UV–irradiating solns. comprising alkyl-(meth)acrylate(s), solvents and polymerisation initiators, Sekisui Chem Ind Co Ltd, AN 1991–328011 (45), 19910925.

* cited by examiner

*Primary Examiner*—Janet Baxter
*Assistant Examiner*—Sin J. Lee
(74) *Attorney, Agent, or Firm*—Thomas H. Magee

(57) ABSTRACT

An edge-covering material and a process for preventing undesirable ridges from exposure of laser-processible, photopolymerizable printing plates premounted on sleeves or cylinders is disclosed. The edge-covering material containing at least one soluble, film-forming polymer, at least one UV absorber, and a solvent or a solvent mixture is applied on the edges of the photo-polymerizable printing plate before imagewise exposure of the photopolymerizable printing plate.

10 Claims, No Drawings

FLEXOGRAPHIC PRINTING FORM MADE BY COVERING THE EDGES OF PHOTOPOLYMERIZABLE PRINTING PLATES FOR FLEXOGRAPHIC PRINTING

This is a division of application Ser. No. 09/009,598 filed Jan. 20, 1998, now abandoned.

BACKGROUND OF THE INVENTION

1. Field of the Invention

The invention pertains to an edge-covering material and a process for preparing a flexographic printing form, whereby a photopolymerizable printing plate bearing a laser mask coating is premounted on a sleeve or cylinder, a laser mask is prepared, the photopolymerizable printing plate is exposed through the laser mask, and the exposed printing plate is washed off and dried.

2. Description of Related Art

Photopolymerizable printing plates are known to be used for preparing flexographic printing forms. The printing surface is produced by exposing imagewise, through a photographic original, a layer photopolymerizable by actinic radiation, and subsequently removing the unexposed, unphotopolymerized areas of the printing plate. Examples are found in the following patents: DE-C 22 15 090, EP-A 0 322 585 and U.S. Pat. No. 4,323,636.

Imagewise exposure of the photopolymerizable printing plates requires a photographic original, which is a mask having transparent and opaque areas in the form of an image to be reproduced. This photographic original is usually a photographic negative of the image to be reproduced. If corrections are required for the final image, a new original must be prepared. The same original can yield varying results, depending on processing conditions (temperature, humidity), so that registration problems can arise in the printing form montage. To simplify this time-consuming and costly process, photopolymerizable printing plates are provided with an additional layer that can be processed into an integrated original. Such materials having infrared (IR)-ablative, ultraviolet (UV)-absorbing layers and a process for their preparation and processing are described in WO 94/03838, WO 94/03839 and WO 96/16356. The integrated photomask is prepared by laser exposure.

The development of such materials is directed to distinctly simplifying the preparation of accurately registered cylinder shells, the so-called sleeves, and cylinders, in addition to direct processing of digital information and higher resolution in the resulting flexographic printing forms. This results from the montage of sections of laser-writeable, photopolymerizable, flexographic printing plates on the sleeve or cylinder. The sections can be positioned with a high degree of tolerance, because exposure with the precisely controlled laser head yields accurately registered alignment of the elements of the ultimate printed image. Sleeves or cylinders thus recorded are then exposed with UV in a circular exposure unit and washed off. Unfortunately, polymerized ridges remain on the edges of the plate sections and subsequently print in an undesirable manner.

During the preparation of ready-to-print cylinders or sleeves from sections of conventionally finished flexographic printing plates, it is possible to remove the unwanted ridges that result from exposure of the printing plate edges. Such plates can be cut before the montage is assembled. Even with laser-processed printing plates, there is the possibility of subsequent removal of undesirable ridges, for example, by cutting with sharp knives. However, this operation takes time, the danger of distorting the printing forms is very great, especially if the subject runs close to the edge of the printing form, and removing the severed ridge without leaving a residue is very expensive.

Therefore, the problem involved in the present invention is to avoid the disadvantages of the current state of the art and to reliably, rapidly and simply prevent the ridges from occurring in processing laser-processible, flexographic printing plates in a circular exposure unit.

SUMMARY OF THE INVENTION

This problem was solved surprisingly by an edge-covering material for photopolymerizable printing plates, containing at least one soluble, film-forming polymer, at least one UV absorber, and a solvent or solvent mixture, and by a process for preparing a flexographic printing form, in which a) a photo-polymerizable printing plate containing a laser mask coating is premounted on a sleeve, b) a laser mask is prepared, c) the photopolymerizable printing plate is exposed through the laser mask, and d) the resulting exposed printing plate is washed off and dried, characterized in that an edge-covering material containing at least one soluble film-forming polymer, at least one UV absorber, and a solvent or solvent mixture is applied on the edges of the photopolymerizable printing plate before the preparation of the laser mask in step b) or before the imagewise exposure of the photopolymerizable printing plate in step c).

DESCRIPTION OF THE PREFERRED EMBODIMENT(S)

Surprisingly, printing plate edges and also thicker flexographic printing plates are covered completely by the process and the edge-covering material of the present invention. Thus, edge exposure can be avoided and the unwanted ridges caused thereby can be prevented.

The polymer solutions of this invention to treat printing plates are prepared by dissolving a soluble, film-forming polymer and a UV absorber in an organic solvent. Useful polymers can be all known soluble, film-forming polymers, preferably those that dissolve well in the washoff solvent for the exposed printing plates. In particular, polymeric binders of the printing plate to be exposed are used. Particularly suitable are thermoplastic, elastomeric, block copolymers, as described in DE-C 22 15 090, EP-A 0 322 585 and U.S. Pat. No. 4,323,636. Particularly suitable binders are linear and radial block copolymers having polystyrene end blocks such as, for example, polystyrene-polybutadiene-polystyrene, (polystyrene-polybutadiene)$_4$Si or the corresponding isoprene polymers. The average molecular weight $M_n$ of the block copolymers is usually between 80,000 and 300,000, preferably between 100,000 and 250,000. A polystyrene proportion of 10–40 percent by weight is advantageous, and particularly a proportion of 15–30 percent by weight. Selecting for the soluble, film-forming polymer the binders that are also used as flexographic printing plate components in the printing plate to be treated ensures that the edge-covering material of the invention is removed in the washoff process for the exposed printing plate without leaving a residue.

Useful UV absorbers are those absorbing in the range of 300–400 mm, preferably at 360 mn. Particularly suitable compounds are those compatible with the film-forming polymers. Typical examples are benzophenol derivatives such as, for example, 2,2'-dihydroxy-4,4'-dimethoxybenzophenol, benzotriazole, or benzotriazole derivatives. Particularly preferred are benzotriazole derivatives such as, for example, 2-(2-hydroxy-3,5-di-t-amylphenyl)-2H-benztriazole.

Useful solvents are the usual coating solvents for preparing printing plates. Particularly suitable are easily volatile solvents that have a high solvent capability for the film-forming polymer. Partially dissolving or loosening the laser mask layer can be avoided by suitable selection of the organic solvent. Toluene, xylene, methyl ethyl ketone, ethyl acetate, and their mixtures are preferred.

The edge-covering materials of the invention optionally also contain a thixotropic agent. This makes possible a reliable covering for the upper parts of the edges even with thick plates. All current thixotropic agents can be used such as, for example, bentonites, kaolins, and silicas. Pyrogenic silicas are particularly suitable.

The edge-covering materials can also contain dyes and/or pigments. All known dyes and pigments are suitable. Examples are inorganic and organic pigments, carbon, metal phthalocyanines, azo dyes, etc. Metal phthalocyanines are particularly preferred, especially Zapon Blue 807 (C.I. 74400).

A suitable viscosity for the edge-covering materials of the invention is regulated by the solids content and/or thixotropic agent content to permit even application on the lateral edges of the photopolymerizable printing plate and to yield the most uniformly possible thick film on these sites. This avoids drop formation and runs. The viscosity is preferably 1–3 Pa(sec).

Applying the edge-covering materials of the invention on the printing plate edges is accomplished by methods currently known to the expert, such as brushing, spraying, etc., preferably with a fine nozzle. A special advantage in the materials and process of the present invention is that these can be used for numerous known plate materials, and it is thus possible to improve considerably the quality of flexographic printing forms and the resulting printing without having to adopt expensive and extravagant measures.

The present material and process can be used for photopolymerizable printing plates that contain at least one polymeric binder, at least one ethylenically unsaturated compound that can be addition-polymerized by actinic radiation, and a photoinitiator or a photoinitiator system, and that can be exposed imagewise without an additional photographic original. Materials suitable within the concept of the present invention are, in particular, the materials having IR-ablative, UV-absorbing layers described in WO 94/03838, WO 94/03839 and WO 96/16356 for preparing integrated photomasks. Processes for their preparation and processing are also described in WO 94/03838, WO 94/03839 and WO 96/16356.

The following examples explain the invention in detail. Unless otherwise stated, the parts and percentages are by weight.

EXAMPLES

Example 1

A toluene solution was prepared by dissolving 90 parts of a linear polystyrene-polyisoprene-polystyrene block copolymer (polystyrene content 15%, Brookfield viscosity of a 25% solution in toluene=1600 mPa(sec)), 10 parts Tinuvin (mixture of alpha-(3-(3-(2H-benzotriazole-2-yl)-5-(1,1-dimethylethyl)-4-hydroxyphenyl)-1-oxypropyl)-omega-hydroxypoly(oxy-1,2-ethanediyl) and alpha-(3-(3-(2H-benzotriazole-2-yl)-5-(1,1dimethylethyl)-4-hydroxyphenyl)-1-oxopropyl)-omega-(3-(3-(2H-benzotriazole-2-yl)-5-(1,1-dimethylethyl-4-hydroxyphenyl)-1-oxopropoxy)poly(oxy-1,2-ethanediyl)), and 5 parts of a pyrogenic silica ($SiO_2$ content>99.8%, surface by BET method 200 m2/g, primary particle size 12 nm). The solids content of the solution was 28.6%. The viscosity was ca. 1600 Pa(sec).

The solution was applied with a fine pipette on a part of the lateral edges of commercial Cyrel® DPS plate sections from the DuPont Company, which were adhered on a cylinder. After the solution dried, the sections were disassembled, exposed, and washed off. The area of the lateral edges covered by the solution was free of polymerized material. The other area showed the undesirable ridges.

Example 2

A 1:1 toluene:ethyl acetate solution was prepared by dissolving 68 parts of a mixture of radial (polystyrene-polybutadiene)$_4$Si block copolymer (polystyrene content 30%, Brookfield viscosity of a 25% solution in toluene=2500 mPa(sec)) and a polystyrene-polybutadiene diblock copolymer (polystyrene content 25%, Brookfield viscosity of a 25% solution in toluene=2300 mPa(sec)) in a 1:2 ratio, 20 parts 2-(2-hydroxy-3,5-di-t-amyl-phenyl)-2H-benztriazole, 12 parts of a pyrogenic silica ($SiO_2$ content>99.8%, surface by BET method 200 m$^2$/g, primary particle size 12 nm), and 0.005 part of a blue dye (C.I. 74400). The solids content was 28%. The solution was processed as described in Example 1. The area of the lateral edges covered by the solution was free of polymerized material. The other area showed the undesirable ridge.

We claim:

1. A photopolymerizable printing plate for preparing a flexographic printing form having edges mounted on a cylinder, said printing plate containing a laser mask coating thereon, characterized in that an edge-covering material is disposed on the edges of the printing plate, said edge-covering material consisting essentially of at least one soluble film-forming polymer, at least one UV absorber, and a solvent or solvent mixture.

2. The photopolymerizable printing plate according to claim 1, characterized in that thermoplastic, elastomeric, block copolymers are used as the soluble, film-forming polymer.

3. The photopolymerizable printing plate according to claim 1, characterized in that compounds having high absorption at 360 nm and compatible with the film-forming polymer are used as UV absorbers.

4. The photopolymerizable printing plate according to claim 1, characterized in that toluene, xylene, methyl ethyl ketone, or ethyl acetate are used as solvents.

5. The photopolymerizable printing plate according to claim 1, characterized in that the edge-covering material also contains at least one thixotropic agent.

6. The photopolymerizable printing plate according to claim 5, characterized in that pyrogenic silica is used as the thixotropic agent.

7. The photopolymerizable printing plate according to claim 1, characterized in that the edge-covering material also contains a dye and/or a pigment.

8. The photopolymerizable printing plate according to claim 1, characterized in that the edge-covering material has a viscosity of 1–3 Pa(sec).

9. A process for preparing a flexographic printing form, wherein a) a photopolymerizable printing plate bearing a laser mask layer is premounted on a sleeve or a cylinder, b) a laser mask is prepared, c) the photopolymerizable printing plate is exposed through the mask, and d) the resulting exposed printing plate is washed off and dried, characterized in that an edge-covering material is applied on the edges of the photopolymerizable printing plate before the preparation of the laser mask in step b) or before the imagewise exposure of the photopolymerizable printing plate in step c), said edge-covering material consisting essentially of at least one soluble film-forming polymer, at least one UV absorber, and a solvent or solvent mixture.

10. A process for preparing a flexographic printing form, wherein a) a photopolymerizable printing plate bearing a laser mask layer is premounted on a sleeve or cylinder, b) a laser mask is prepared, c) the photopolymerizable printing plate is exposed through the mask, and d) the resulting exposed printing plate is washed off and dried, characterized in that an edge-covering material is applied on the edges of the photopolymerizable printing plate before the preparation of the laser mask in step b) or before the imagewise exposure of the photopolymerizable printing plate in step c), said edge-covering material consisting essentially of at least one soluble film-forming polymer, at least one UV absorber, and a solvent or solvent mixture, said edge-covering material being applied along the edges of the photopolymerizable printing plate by means of a fine nozzle.

* * * * *